(12) United States Patent
Nishimoto (10) Patent No.: US 8,327,795 B2
(45) Date of Patent: Dec. 11, 2012

(54) MICROWAVE PLASMA PROCESSING APPARATUS AND METHOD OF SUPPLYING MICROWAVES USING THE APPARATUS

(75) Inventor: Shinya Nishimoto, Amagasaki (JP)

(73) Assignee: Tokyo Electron Limited (JP)

( * ) Notice: Subject to any disclaimer, the term of this patent is extended or adjusted under 35 U.S.C. 154(b) by 584 days.

(21) Appl. No.: 12/487,199

(22) Filed: Jun. 18, 2009

(65) Prior Publication Data

US 2009/0314629 A1    Dec. 24, 2009

(30) Foreign Application Priority Data

Jun. 18, 2008   (JP) ................. 2008-159630
May 13, 2009   (JP) ................. 2009-116336

(51) Int. Cl.
*C23C 16/00* (2006.01)
*C23F 1/00* (2006.01)
*H01L 21/306* (2006.01)

(52) U.S. Cl. ....... 118/723 MW; 156/345.41; 118/723 R
(58) Field of Classification Search .......... 118/723 MW, 118/723 R; 156/345.41

See application file for complete search history.

(56) References Cited

U.S. PATENT DOCUMENTS

| 5,698,036 A | * | 12/1997 | Ishii et al. ............. 118/723 MW |
| 2002/0066536 A1 | * | 6/2002 | Hongoh et al. .......... 156/345.41 |
| 2009/0194236 A1 | * | 8/2009 | Ono et al. ................ 156/345.41 |

FOREIGN PATENT DOCUMENTS

| JP | 9-63793 | | 3/1997 |
| WO | WO 2006001253 | * | 1/2006 |

* cited by examiner

*Primary Examiner* — Rakesh Dhingra
(74) *Attorney, Agent, or Firm* — Cantor Colburn LLP (57) ABSTRACT

A transmission path of microwaves even after a temperature increases, is maintained in an appropriate state. A microwave plasma processing apparatus performs plasma processing on a substrate by exciting gas due to the electric field energy of microwaves emitted from a slot plate of a radial line slot antenna (RLSA). The microwave plasma processing apparatus includes: a processing container in which plasma processing is performed; a microwave source outputting microwaves; a rectangular waveguide transmitting the microwaves outputted from the microwave source; a coaxial converter converting a mode of the microwaves transmitted to the rectangular waveguide; a coaxial waveguide transmitting the microwaves of which the mode is converted by the coaxial converter; a taper-shaped connector attached to an inner conductor of the coaxial waveguide without contacting the slot plate; and an elastic body electrically connecting the taper-shaped connector and the slot plate.

9 Claims, 10 Drawing Sheets

After temperature of microwave plasma processing apparatus increases according to design After temperature of microwave plasma processing apparatus actually increases

MICROWAVE PLASMA PROCESSING APPARATUS AND METHOD OF SUPPLYING MICROWAVES USING THE APPARATUS

CROSS-REFERENCE TO RELATED PATENT APPLICATIONS

This application claims the benefit of Japanese Patent Application No. 2008-159630, filed on Jun. 18, 2008, and Japanese Patent Application No. 2009-116336, filed on May 13, 2009, in the Japan Patent Office, the disclosure of which is incorporated herein in its entirety by reference.

BACKGROUND OF THE INVENTION

1. Field of the Invention

The present invention relates to a microwave plasma processing apparatus and a method of supplying microwaves, and more particularly, to a microwave plasma processing apparatus that performs plasma-processing on an object to be processed by exciting gas due to the electric field energy of microwaves emitted from a radial line slot antenna (RLSA), and a method of supplying microwaves using the microwave plasma processing apparatus.

2. Description of the Related Art

Microwave plasma is generated by introducing microwaves into a processing container in a depressurized state and by exciting gas due to the electric field energy of the introduced microwaves. In microwave plasma processing apparatuses, when the electron density of plasma is higher than a cut-off density, microwaves cannot be absorbed into plasma and thus, are propagated between a dielectric plate and plasma, and some of the microwaves are absorbed into the plasma and are used to sustain the plasma.

According to the principle of generating plasma, since microwave plasma has a higher electron density (Ne) and a lower electron temperature (Te) than plasma that is generated by a capacitively coupled microwave plasma processing apparatus or an inductively coupled plasma processing apparatus, a high-quality device can be manufactured at high rate and with little damage by performing plasma processing.

A microwave plasma processing apparatus using a radial line slot antenna (RLSA) has been proposed (i.e., see Japanese Laid-Open Patent Publication No. hei 9-63793). The RLSA has a structure in which a wavelength-shortening plate having a disk shape is placed on a disk-shaped slot plate having a plurality of slots formed therein, and is disposed on a dielectric window formed in an opening of a ceiling part of a processing container. The middle part of the RLSA is connected to a coaxial waveguide.

In the above-described structure, microwaves of 2.45 GHz, for example, outputted from a microwave source, are transmitted to the wavelength-shortening plate of the RLSA via the coaxial waveguide so as to radiate in a radial direction of the wavelength-shortening plate. As such, microwaves can be emitted from the plurality of slots formed in the slot plate and can be radiated into the processing container.

Figure 8:
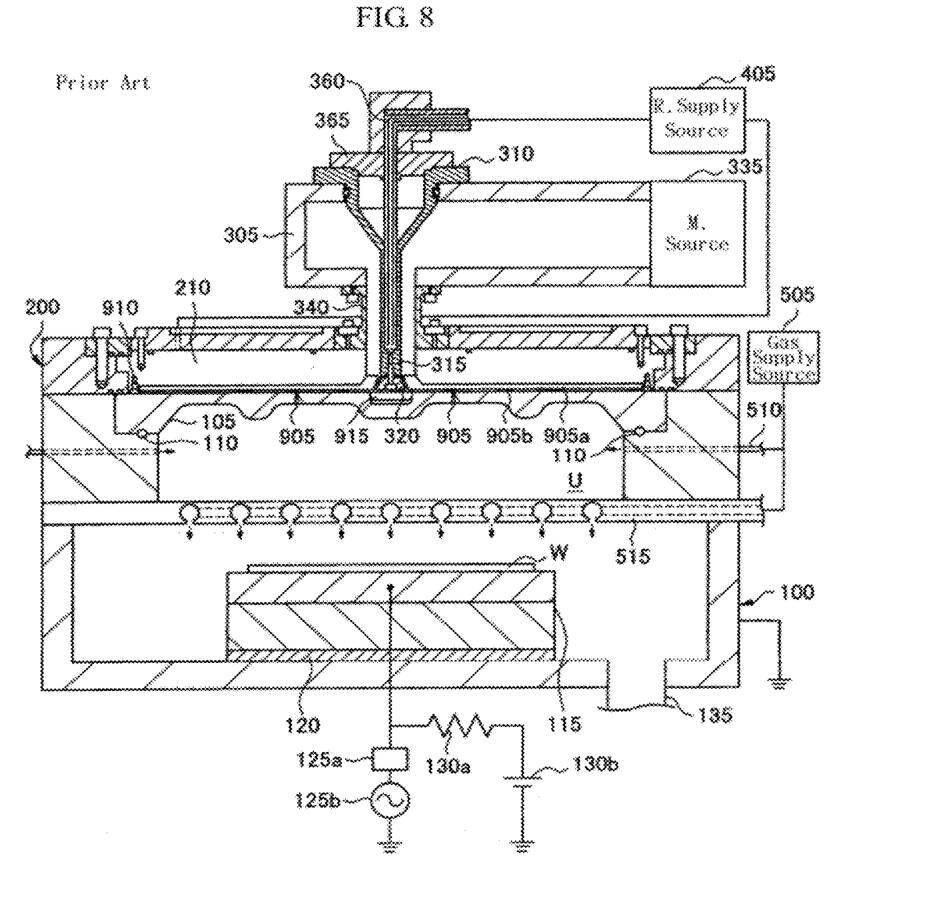
FIG. 8 is a longitudinal cross-sectional view of a general microwave plasma processing apparatus.

However, during a plasma process, the processing container is maintained at a high temperature of 200° C. and more, and as a result, an RLSA 905, a cooling jacket 210, an outer conductor 340 of the coaxial waveguide, a rectangular waveguide 305, which are shown in FIG. 8, are thermally expanded. Thus, during the plasma process, even though a circumferential part of the RLSA 905 is cooled by the cooling jacket 210, the temperature of the RLSA 905 increases about 150° C. to about 165° C. and the temperature of the cooling jacket 210 placed above the RLSA 905 increases about 80° C. to about 100° C. and the temperature of the external conductor 340 increases about 40° C. to about 60° C., and a temperature of 100° C. and more may be heated up even near the outer conductor 340 according to the plasma process.

Referring to FIG. 8, among these members, a wavelength-shortening plate 905a (see FIG. 8) of the RLSA 905 is formed of a dielectric material such as alumina ($Al_2O_3$). Meanwhile, the cooling jacket 210, the outer conductor 340, and the rectangular waveguide 305, which are placed above the RLSA 905, are formed of metal such as copper (Cu) or aluminum (Al). The linear expansion coefficient of alumina is $7.0\times10^{-6}$(/° C.). The linear expansion coefficient of copper is $16.7\times10^{-6}$(/° C.) and the linear expansion coefficient of aluminum is $23.5\times10^{-6}$(/° C.), which are more than twice that of alumina. Thus, when a temperature increases, the RLSA 905, the cooling jacket 210, the outer conductor 340, and the rectangular waveguide 305 are thermally expanded, and thus an upper part of the rectangular waveguide 305 is displaced to a higher location than that before the temperature increases.

In this case, if a slot plate 905b of the RLSA 905 is screw-fixed to a taper-shaped connector part (hereinafter, referred to as a taper connector) attached to an inner conductor 315 of the coaxial waveguide, a coaxial converter 310, the inner conductor 315, and the taper connector, which are integrally formed as one body with one another, are displaced in a vertical upward direction of a processing container 100, following the outward displacement of the position of the rectangular waveguide 305 in an outside direction of the processing container 100.

In particular, the inner conductor 315 and the coaxial converter 310 allow a refrigerant to pass through to the outside of a refrigerant pipe 360 from the inside of the refrigerant pipe 360, which is a double pipe installed within the inner conductor 315, and thus are cooled even during the plasma process. Thus, the temperature of the inner conductor 315 and the temperature of the coaxial converter 310 during the process are lower than the temperature of the outer conductor 340 and the temperature of the rectangular waveguide 305. Thus, the thermal expansion rate of the coaxial converter 310 and the inner conductor 315 during the plasma process is lower than the thermal expansion rate of the outer conductor 340 and the rectangular waveguide 305. As such, in contrast with an ideal state shown in the upper drawing of FIG. 9, in the lower drawing of FIG. 9, when a temperature increases, a lower surface of a taper connector 320 connected to the inner conductor 315 is displaced in an upper direction away from a lower surface of the wavelength-shortening plate 905a, and an air gap Ra between the taper connector 320 and thus the wavelength-shortening plate 905a varies. The air gap Ra is part of a transmission path of the microwaves and thus, it is important to maintain the air gap Ra so as to stabilize a mode of the microwaves. If the air gap Ra varies, the mode of the microwaves is unstable, and plasma is non-uniform.

Figure 9:
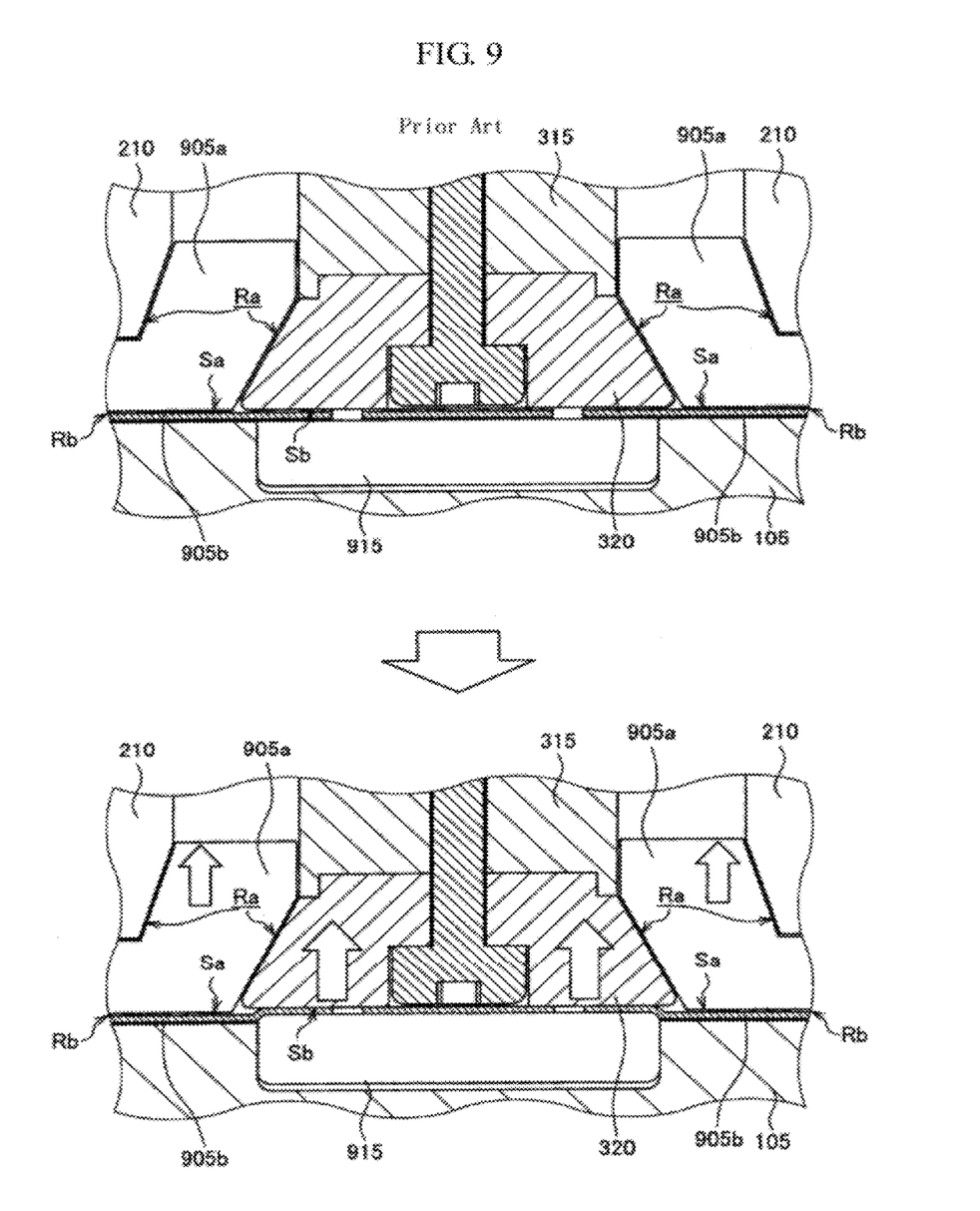
FIG. 9 illustrates a state of the general microwave plasma processing apparatus of FIG. 8 after a temperature of the general microwave plasma processing apparatus of FIG. 8 increases according to a design and a state of the general microwave plasma processing apparatus of FIG. 8 after the temperature thereof actually increases.

In addition, if, when a temperature increases, the taper connector 320 is displaced in an upper direction away from the wavelength-shortening plate 905a, the slot plate 905b screw-fixed to the lower surface of the taper connector 320 is also displaced upward and is distorted. Thus, the transmission path of the microwaves varies, and uniform plasma is not generated.

SUMMARY OF THE INVENTION

To solve the above and/or other problems, the present invention provides a plasma processing apparatus with Radial Line Slot Antenna or the plasma processing method which enables to suppress the variation of the microwave transmission path from the designed ideal microwave transmission path of elevated temperature when microwave is supplied and the apparatus is heated up and further to prevent the disturbance of the plasma.

According to an aspect of the present invention, there is provided a microwave plasma processing apparatus which performs plasma processing on an object to be processed due to plasma generated by using microwaves emitted from a slot plate of a radial line slot antenna (RLSA), the apparatus including: a processing container in which plasma processing is performed; a microwave source outputting microwaves; a rectangular waveguide transmitting the microwaves outputted from the microwave source; a coaxial converter converting a mode of the microwaves transmitted to the rectangular waveguide; a coaxial waveguide transmitting the microwaves of which the mode is converted by the coaxial converter; a taper-shaped connector attached to an inner conductor of the coaxial waveguide without contacting the slot plate; and an elastic body electrically connecting the taper-shaped connector and the slot plate.

According to this, the elastic body may electrically connect the taper-shaped connector and the slot plate that does not contact the taper-shaped connector. As such, referring to the lower portion of FIG. 4, the elastic body 330 may maintain electrical connection between the taper connector 320 and the slot plate 205b while absorbing the upward displacement of the taper connector 320 due to thermal expansion. Thus, when a temperature increases, the lower surface Sb of the taper connector 320 and the lower surface Sa of the wavelength-shortening plate 205a may be located at the same level. As such, the air gap Ra may not vary, and thus the mode of the microwaves may be stable and uniform plasma may be generated.

Figure 4:
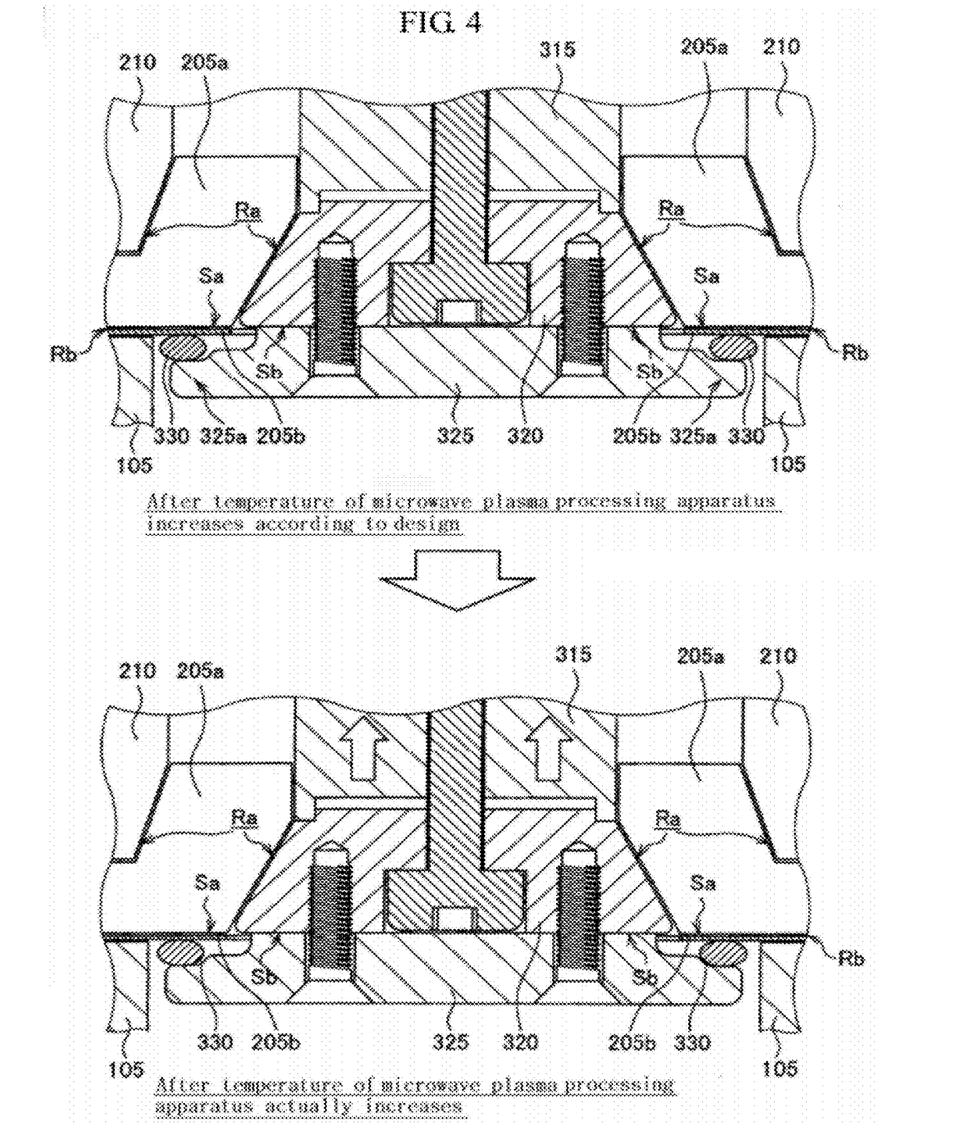
FIG. 4 illustates a state of the microwave plasma processing apparatus of FIG. 1 after a temperature of the microwave plasma processing apparatus of FIG. 1 increases according to a design and a state of the microwave plasma processing apparatus of FIG. 1 after the temperature thereof actually increases.

According to this, the slot plate 205b is not screw-fixed to the lower surface of the taper connector 320, and thus is not displaced in an upper direction. As such, the mode of the microwaves may be stable, and uniform plasma may be generated.

In addition, the elastic body may be a linear metal shield member.

The slot plate may include an opening that is larger than an area of an end surface of the taper-shaped connector, and the taper-shaped connector may be connected to a support member while penetrating the opening of the slot plate, and the elastic body may be disposed on the loading table.

The support member may include a flange part formed at an outer circumference of the loading table, and the elastic body may be disposed between the flange part and the slot plate.

The flange part of the support member may include a stepped part, and the elastic body may be disposed at an outer side than the innermost stepped part formed in the flange part.

A distance between the flange part of the support member and the slot plate may be set so that the elastic body absorbs the displacement of the taper-shaped connector due to an expansion and electrically connects the taper-shaped connector and the slot plate.

In addition, edges of the stepped part of the flange part may be rounded. According to this, the electric field energy of the microwaves may be prevented from being concentrated on the edges of the stepped part of the flange part, and occurrence of abnormal discharge may be prevented.

An insulating material may be coated on the surface of at least one of the group consisting of the wavelength-shortening plate and a cooling jacket that is disposed on the RLSA.

According to this, the insulating material may be coated on the wavelength-shortening plate or the cooling jacket so that a difference in electric potential generated between the cooling jacket and the slot plate may be reduced and thus occurrence of abnormal discharge can be suppressed. In addition, the insulating material may be polytetrafluoroethylene (PTFE), tetrafluoroethylene-perfluoroalkylvinylether (PFA) copolymers, alumina (alumite processing, spraying), or the like.

According to another aspect of the present invention, there is provided a method of supplying microwaves to a microwave plasma processing apparatus which performs plasma processing on an object to be processed due to plasma generated by using microwaves emitted from a slot plate of a radial line slot antenna (RLSA), the method including: outputting microwaves from a microwave source; transmitting the microwaves outputted from the microwave source to a rectangular waveguide; converting a mode of the microwaves by using a coaxial converter; and electrically connecting a taper-shaped connector attached to an inner conductor of a coaxial waveguide and the slot plate by using an elastic body without contacting the slot plate.

According to this, the taper-shaped connector may be attached to the inner conductor without contacting the slot plate. The elastic body may electrically connect the taper-shaped connector with the slot plate while absorbing the upward displacement of the taper connector due to thermal expansion. Thus, when a temperature increases, the lower surface of the taper-shaped connector and the lower surface of the wavelength-shortening plate may be located at the same level. As such, the air gap Ra may not vary, and the mode of the microwaves may be stable, and uniform plasma may be generated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

<Entire Structure of Microwave Plasma Processing Apparatus>

Figure 1:
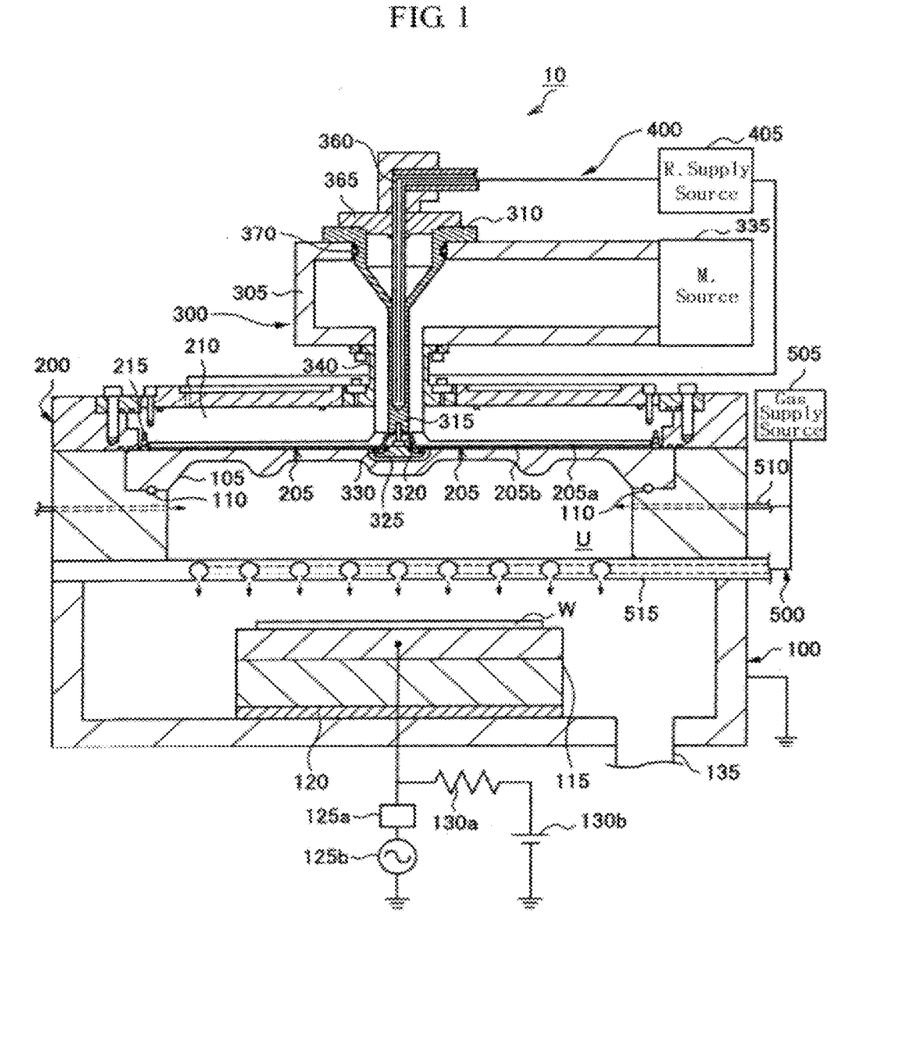
FIG. 1 is a longitudinal cross-sectional view of a microwave plasma processing apparatus according to an embodiment of the present invention.

FIG. 1 is a longitudinal cross-sectional view of a microwave plasma processing apparatus 10 according to an embodiment of the present invention. Referring to FIG. 1, the microwave plasma processing apparatus 10 according to the present embodiment includes a processing container 100, a cover object 200, a transmission path 300, a cooling mechanism 400, and a gas supply mechanism 500.

The processing container 100 is a cylindrical container which is open at the top, and is formed of a metal such as aluminum (Al). A top plate 105 (which corresponds to a dielectric window) is fit into the opening of a ceiling of the processing container 100, and is formed of a dielectric material. An extension is formed in the central part of a lower surface of the top plate 105, and a middle part of the lower surface of the top plate 105 extends in a circumferential direction of the top plate 105. An O-ring 110 is disposed at a point at which the processing container 100 and the top plate 105 contact each other. As such, a processing chamber U is sealed.

A susceptor (holding stage) 115, on which a wafer W is held, is installed on a bottom of the processing container 100 using an insulator 120, which is interposed between the susceptor 115 and the bottom of the processing container 100. A radio frequency power supply source 125b is connected to the susceptor 115 via a matching device 125a, and a predetermined bias voltage is applied to the processing container 100 due to a radio frequency power outputted from the radio frequency power supply source 125b. Also, a high pressure direct current (DC) power supply source 130b is connected to the susceptor 115 via a coil 130a, and the wafer W is electrostatically held due to a DC voltage outputted from the high pressure DC power supply source 130b. Since a vacuum pump (not shown) is attached to the processing container 100, gas in the processing container 100 is exhausted via a gas exhaust pipe 135, and thus the processing chamber U is depressurized to a desired vacuum level.

The cover 200 includes a radial line slot antenna (RLSA) 205, hereinafter simply referred to as an antenna 205, and a cooling jacket 210. The antenna 205 is disposed directly on the top plate 105. The cooling jacket 210 is disposed on the antenna 205. The cooling jacket 210 is formed of aluminum, and a refrigerant is circulated in a flow path formed in the cooling jacket 210 so that a temperature near the antenna 205 is adjusted. The cooling jacket 210 is grounded.

Figure 2:
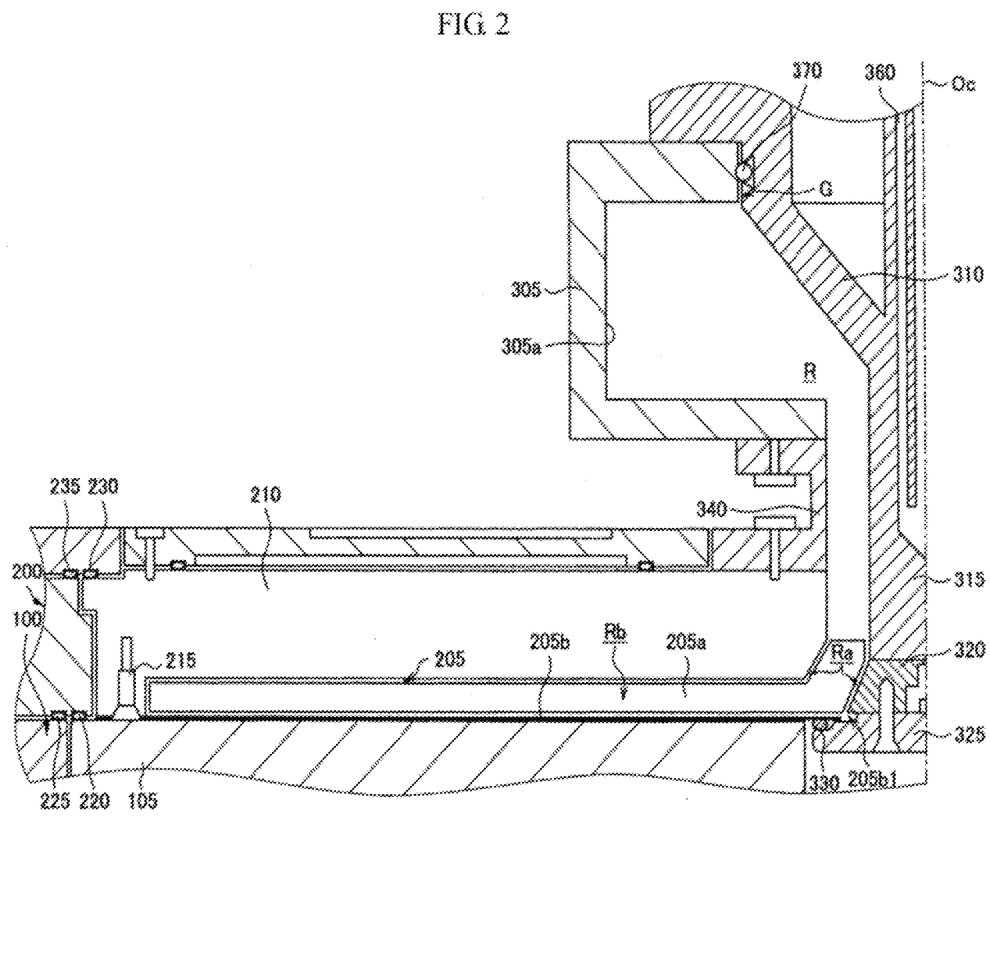
FIG. 2 is a view of a path, in which microwaves are propagated, of the microwave plasma processing apparatus of FIG. 1.

FIG. 2 is an enlarged longitudinal cross-sectional view of a left part of the antenna 205 of the microwave plasma processing apparatus 10 of FIG. 1. Referring to FIG. 2, the antenna 205 is a disk-shaped flat plate having a wavelength-shortening plate 205a and a slot plate 205b.

Figure 3:
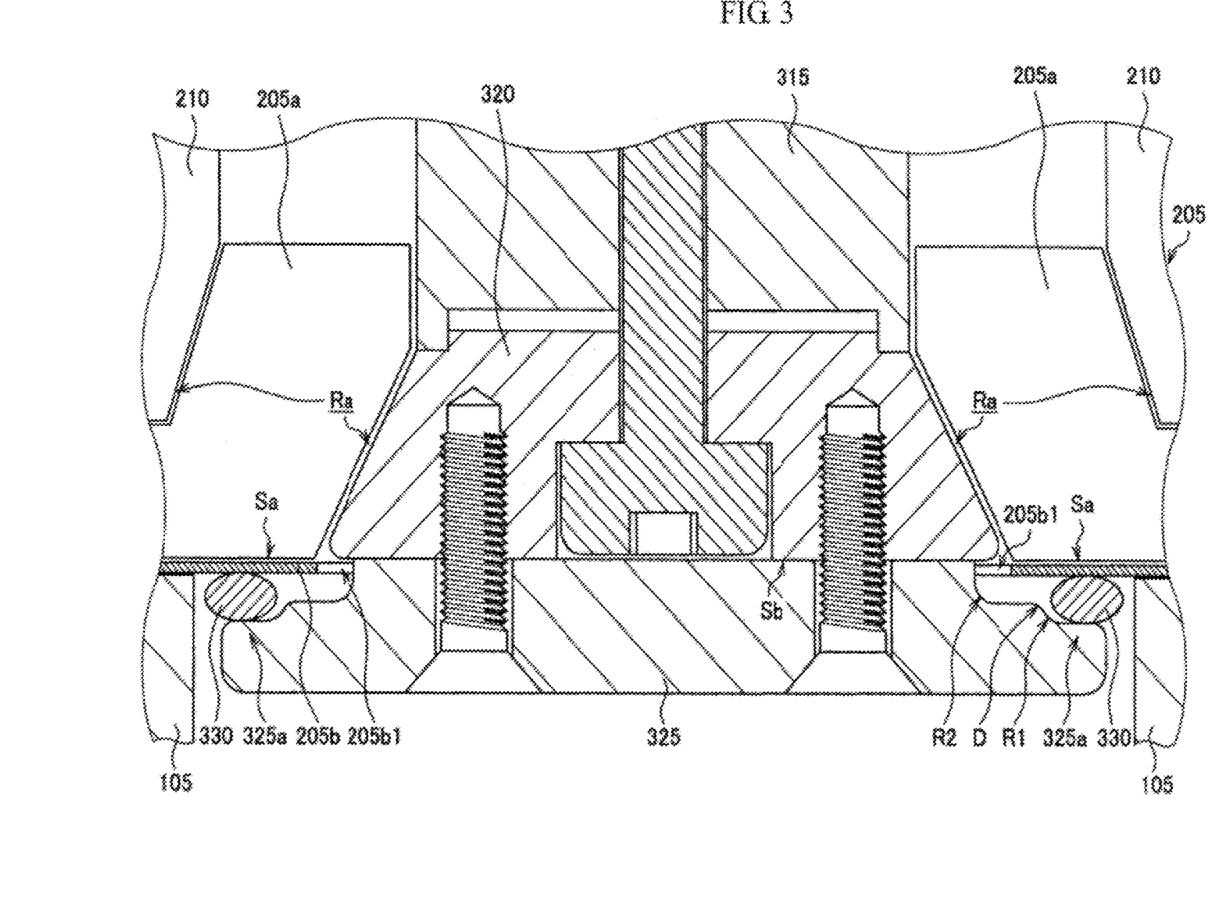
FIG. 3 is an enlarged view of a circumferential part of a taper connector of the microwave plasma processing apparatus of FIG. 1.

The slot plate 205b is formed of a metal sheet and is inserted between the top plate 105 (dielectric window) and the wavelength-shortening plate 205a. FIG. 3 is an enlarged view of a circumferential part of a taper connector 320 of the microwave plasma processing apparatus 10 of FIG. 1. Referring to FIG. 3, a circular opening 205b1 that is larger than the area of a lower surface Sb of the taper connector 320 is formed in the middle of the slot plate 205b. A support member 325 is screw-fixed to the lower surface Sb of the taper connector 320, and passes through the opening 205b1 formed in the middle of the slot plate 205b. A plurality of slots (not shown) that radiate microwaves are formed in the slot plate 205b. The slot plate 205b is fixed to the cooling jacket 210 by a screw 215 shown in FIG. 2, in the outer circumference of the slot plate 205b.

The wavelength-shortening plate 205a is formed of a dielectric material such as alumina or the like and transmits microwaves into the slots. Shield members 220, 225, 230, and 235 prevent some of the microwaves, which through the slots, from leaking into a gap at sides of the cooling jacket 210 or a gap between the cover 200 and the processing container 100.

The transmission path 300 mainly includes a rectangular waveguide 305, a coaxial converter 310, an inner conductor 315, an outer conductor 340, the taper connector 320, and the antenna 205. The microwaves are transmitted to a space (hereinafter, referred to as a transmission path R of the microwaves) that is defined by the transmission path 300. In this regard, the microwaves are propagated within the wavelength-shortening plate 205a and are reflected from an end surface of the wavelength-shortening plate 205a. Impedance of a discharge load and the transmission path 300 are matched by using a tuner (not shown), and standing waves are generated in the space of the transmission path 300 due to interference between progressive waves and reflective waves.

A current of the microwaves flows through the surface of a metal member that defines the transmission path R of the microwaves. The microwaves propagate within the wavelength-shortening plate 205a and are radiated into the processing container 100 from the slots formed in the slot plate 205b that is adjacent to the wavelength-shortening plate 205a.

When the microwave plasma processing apparatus 10 is manufactured, an air gap occurs between the members due to a limit in processing accuracy. For example, an air gap Ra occurs between the wavelength-shortening plate 205a and the cooling jacket 210 and between the wavelength-shortening plate 205a and the taper connector 320 due to a limit in processing accuracy. The air gap Ra is part of the transmission path of the microwaves and thus, it is important to maintain the air gap Ra so as to stabilize a mode of the microwaves.

The rectangular waveguide 305 is connected to a microwave source 335. The coaxial converter 310 is formed to have a cone shape and converts a TE(transverse electric) mode of the microwaves into a mixed mode of the TE mode and a TM(transverse magnetic) mode. The mode-converted microwaves are transmitted to a coaxial waveguide (the inner conductor 315 and the outer conductor 340). The inner conductor 315 and the outer conductor 340 are formed of silver-plated copper.

The taper connector 320 is taper-shaped and is screw-fixed to the internal conductor 315 at a lower surface of the inner conductor 315, as illustrated in FIG. 3.

The support member 325 is screw-fixed to the taper connector 320 at a plurality of places of the lower surface Sb of the taper connector 320. The taper connector 320 and the support member 325 are formed of gold-plated copper. The support member 325 includes a flange part 325a at its outer circumferential part. The flange part 325a is stepped.

An elastic body 330 is disposed between the flange part 325a and the slot plate 205b, and electrically connects the taper connector 320 and the slot plate 205b.

An upper portion of the outer conductor 340 shown in FIG. 2 is screw-fixed to the rectangular waveguide 305, and a lower portion of the outer conductor 340 is screw-fixed to the cooling jacket 210. The air gap Ra occurs between the cooling jacket 210 and the wavelength-shortening plate 205a and between the taper connector 320 and the wavelength-shortening plate 205a due to a limit in processing accuracy.

The coaxial converter 310 is inserted in an opening formed in the rectangular waveguide 305, and when the rectangular waveguide 305 and the coaxial converter 310 are assembled, a spiral shield 370 for preventing the microwaves from leaking is formed in a gap G that is occurred between surfaces of the rectangular waveguide 305 and the coaxial converter 310, which face each other.

A refrigerant pipe 360 is inserted in the inner conductor 315 of FIG. 1. The refrigerant pipe 360 is a double pipe. In the cooling mechanism 400 of FIG. 1, a refrigerant supply source 405 and the refrigerant pipe 360 are connected to each other, and the refrigerant supply source 405 and the cooling jacket 210 are connected to each other. A refrigerant supplied from the refrigerant supply source 405 passes through an outside of the refrigerant pipe 360 from an inside of the refrigerant pipe 360, and thus the temperature of the inner conductor 315 is adjusted. Also, the refrigerant supplied from the refrigerant supply source 405 is circulated in the flow path of the cooling jacket 210 so that the temperature near the cooling jacket 210 is adjusted.

In the gas supply mechanism 500 of FIG. 1, a gas supply source 505 and a plurality of upper gas supply lines 510 are connected to each other, and the gas supply source 505 and a shower plate 515 are connected to each other. A plurality of gas supply holes are uniformly formed in the shower plate 515 to face the wafer W. A plasma excitation gas from the gas supply source 505 is supplied in a lateral direction toward the inner space of the processing chamber U through the plurality of upper gas supply lines 510 formed to penetrate a side wall of the processing container 100. A process gas from the gas supply source 505 is supplied to the shower plate 515 in the lateral direction and then supplied in a downward direction from the plurality of gas supply holes formed in the shower plate 515 having a lattice shape.

<Circumference of Taper Connector>

Next, a circumferential part of the taper connector 320 will be described with reference to FIGS. 3 and 4 in detail. In the present embodiment, the slot plate 205b is not fixed to the taper connector 320 and does not contact the taper connector 320, and the slot plate 205b and the taper connector 320 are electrically connected to each other via the elastic body 330. In order to describe the reason why the slot plate 205b is not fixed to the taper connector 320, the microwave plasma processing apparatus 10 of FIG. 1 will be compared with a general microwave plasma processing apparatus shown in FIGS. 8 and 9, in which a slot plate is fixed to a taper connector.

FIG. 8 is a longitudinal cross-sectional view of the general microwave plasma processing apparatus, and FIG. 9 illustrates a state of the general microwave plasma processing apparatus of FIG. 8 after a temperature of the general microwave plasma processing apparatus of FIG. 8 increases according to a design and a state of the general microwave plasma processing apparatus of FIG. 8 after the temperature thereof actually increases. Referring to FIGS. 8 and 9, in the conventional microwave plasma processing apparatus using an RLSA 905, a slot plate 905b is fixed to the cooling jacket 210 by a screw 910 in an outer circumference of the slot plate 905b and the middle part of the slot plate 905b is screw-fixed between the taper connector 320 and a fixing plate 915.

The amount of expansion of each of the members depends on a material used to form each of the members of the conventional microwave plasma processing apparatus or a temperature of a processing container 100 during a plasma process. In particular, an inner conductor 315 and a coaxial converter 310 are cooled even during the plasma process, as described above, and thus, the temperature of the inner conductor 315 and the temperature of the coaxial converter 310 are lower than the temperature of an outer conductor 340 and the temperature of a rectangular waveguide 305. Thus, the thermal expansion rate of the inner conductor 315 and the coaxial converter 310 during the plasma process is lower than the thermal expansion rate of the outer conductor 340 and the rectangular waveguide 305. As such, after a temperature increases, it is not easy to displace a lower surface Sb of the taper connector 320 and a lower surface Sa of the wavelength-shortening plate 905a at a same level as in the upper drawing of FIG. 9. In other words, referring to the lower drawing of FIG. 9, the lower surface Sb of the taper connector 320 is located at a higher position than the lower surface Sa of the wavelength-shortening plate 905a. Thus, the air gap Ra varies, a mode of the microwaves is unstable, and thus plasma is non-uniform.

Also, if the taper connector 320 is displaced in an upper direction from the wavelength-shortening plate 905a, the slot plate 905b that is screw-fixed to the lower surface Sb of the taper connector 320 is also displaced in the upper direction and thus is distorted. As such, the transmission path of the microwaves varies due to deviation of the position of the slot plate 905b, and plasma is non-uniformly generated.

Variation of the transmission path of the microwaves described above affects stability and reliability of a microwave plasma processing apparatus during the plasma process. Thus, as illustrated in FIG. 3, in the microwave plasma processing apparatus 10 according to the present embodiment, the opening 205b1 that is larger than the area of the lower surface Sb of the taper connector 320 is formed in the center of the slot plate 205b.

The taper connector 320 and the support member 325 are connected to the slot plate 205b in a non-contact way while penetrating the opening 205b1 of the slot plate 205b. The flange part 325a is formed at an outer circumference of the support member 325. The elastic body 330 is disposed between the flange part 325a and the slot plate 205b and electrically connects the taper connector 320 and the slot plate 205b.

The elastic body 330 is formed of a linear metal shield member. The reaction force of the metal shield member is less than that of the spiral shield member, and thus, an electrical connection between the slot plate 205b and the support member 325 may be smoothly performed without applying an excessive load to the slot plate 205b or the support member 325.

The elastic body 330 is formed at an outer side than the innermost stepped part formed in the flange part 325a. In addition, edges of the stepped part of the flange part 325a are rounded. Thus, electric field energy of the microwaves may be prevented from being concentrated on an inside or edges of the flange part 325a and occurrence of abnormal discharge may be prevented.

A distance between the flange part 325a of the support member 325 and the slot plate 205b is set so that the elastic body 330 absorbs the displacement of the taper connector 320 due to expansion and electrically connects the taper connector 320 and the slot plate 205b.

In the above structure, the elastic body 330 is disposed so that the taper connector 320 and the slot plate 205b that does not contact the taper connector 320 are electrically connected to each other. FIG. 4 illustates a state of the microwave plasma processing apparatus of FIG. 1 after a temperature of the microwave plasma processing apparatus of FIG. 1 increases according to a design and a state of the microwave plasma processing apparatus of FIG. 1 after the temperature thereof actually increases. As such, referring to the lower drawing of FIG. 4, the elastic body 330 absorbs the upward displacement of the taper connector 320 due to thermal expansion and transmits the microwaves between the taper connector 320 and the slot plate 205b. Thus, after a temperature increases, the lower surface Sb of the taper connector 320 and the lower surface Sa of the wavelength-shortening plate 205a are located at the same level. As such, the air gap Ra does not vary, the mode of the microwaves is stable, and uniform plasma may be generated.

Also, the slot plate 205b is not screw-fixed to the lower surface Sb of the taper connector 320, and thus is not displaced in an upper direction. As such, the transmission path R of the microwaves does not vary, the mode of the microwaves is stable, and uniform plasma may be generated.

In addition, the support member 325 and the elastic body 330 may be integrally formed as one body. In this case, a protrusion (for example, ring-shaped protrusion) is formed at the top surface of the flange part 325a of the support member 325, and is formed of a material having the same function as that of the elastic body 330. Thus, the protrusion that replaces the elastic body 330 absorbs the displacement of the taper connector 320 and electrically connects the taper connector 320 and the slot plate 205b.

<Gap G>

Figure 5:
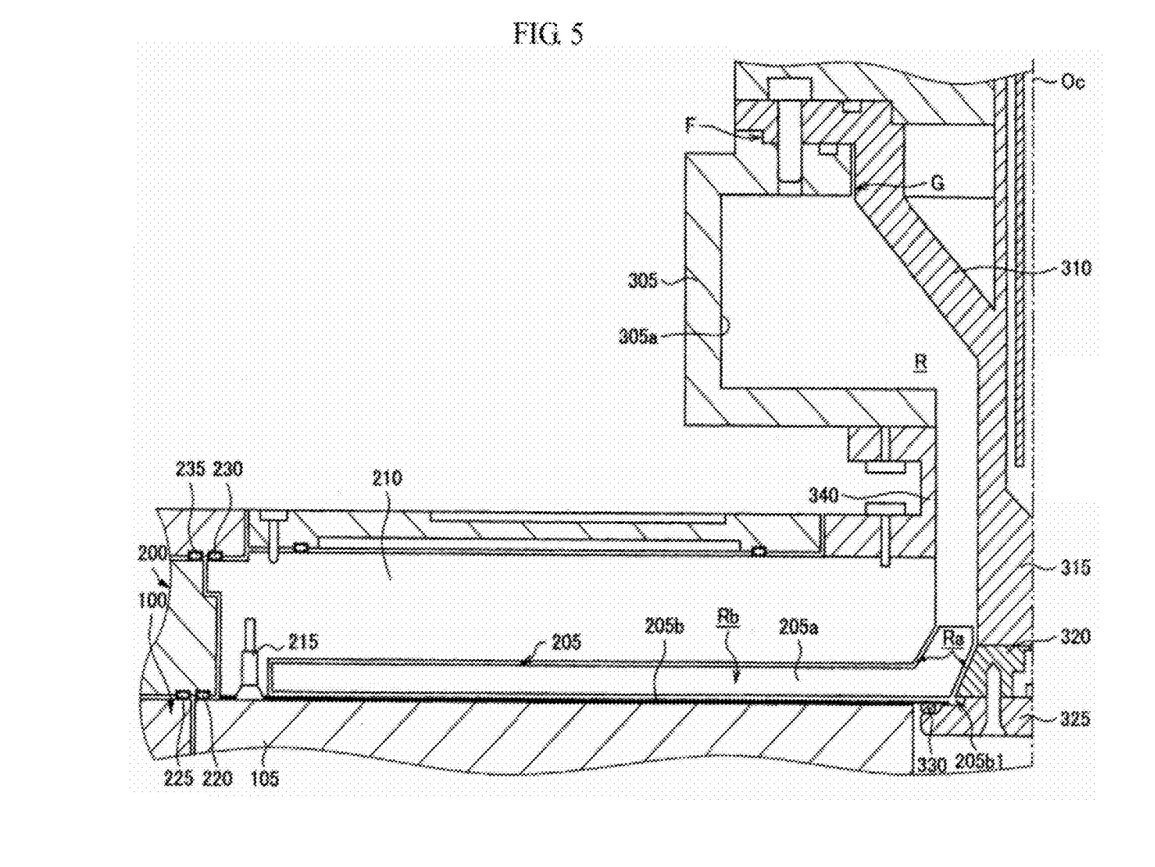
FIG. 5 is a longitudinal cross-sectional view of a microwave plasma processing apparatus including an engagement structure in which a rectangular waveguide and a coaxial converter are engaged with each other, according to another embodiment of the present invention.

FIG. 5 is a longitudinal cross-sectional view of a microwave plasma processing apparatus including an engagement structure F in which a rectangular waveguide 305 and a coaxial converter 310 are engaged with each other, according to another embodiment of the present invention. Referring to FIG. 5, when a path in which the mode of the microwaves transmitted to the rectangular waveguide 305 is converted and the microwaves are transmitted is defined by inserting the coaxial converter 310 into the opening of the rectangular waveguide 305, a gap G is occurred between a lateral sidewall of the rectangular waveguide 305 and a lateral sidewall of the coaxial converter 310 that faces the lateral sidewall of the rectangular waveguide 305, due to tolerance.

The gap G exists in a position in which the mode of the microwaves is converted into a mixed mode of a TE mode and a TM mode from the TE mode. In addition, near the gap G, the microwaves are reflected from a reflective end 305a of the rectangular waveguide 305 and thus, the electric field of the microwaves is prone to be disturbed.

In an experiment, even though a distance between the reflective end 305a and the gap G was designed as λg/2 so that node of the microwaves is placed in the reflective end 305a of the rectangular waveguide 305 and the gap G, abnormal discharge was not suppressed. Thus, in addition to controlling the distance between the reflective end 305a of the rectangular waveguide 305 and the gap G, the engagement structure F is formed in the rectangular waveguide 305 and the coaxial converter 310 so as to control the gap G uniformly.

<Control of Gap>

First, in order to specifically determine proper ranges of the engagement structure F and the gap G, the distribution of the electric field strengths of the microwaves near the gap G was obtained by simulation.

Figure 6A:
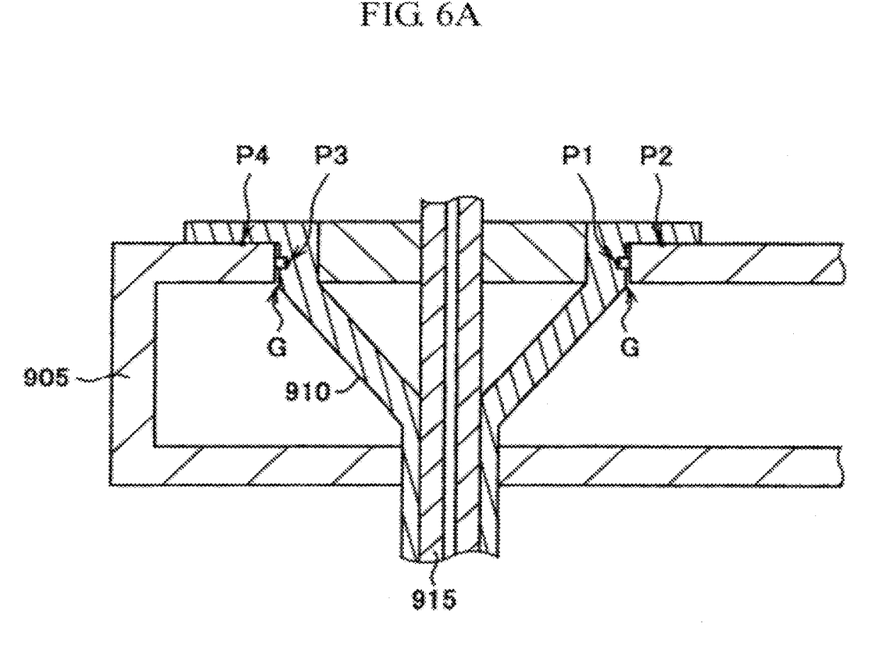
FIGS. 6A and 6B are a cross-sectional view and a graph of the result of simulation of the distribution of the electric field strengths near a gap, respectively.
Figure 6B:
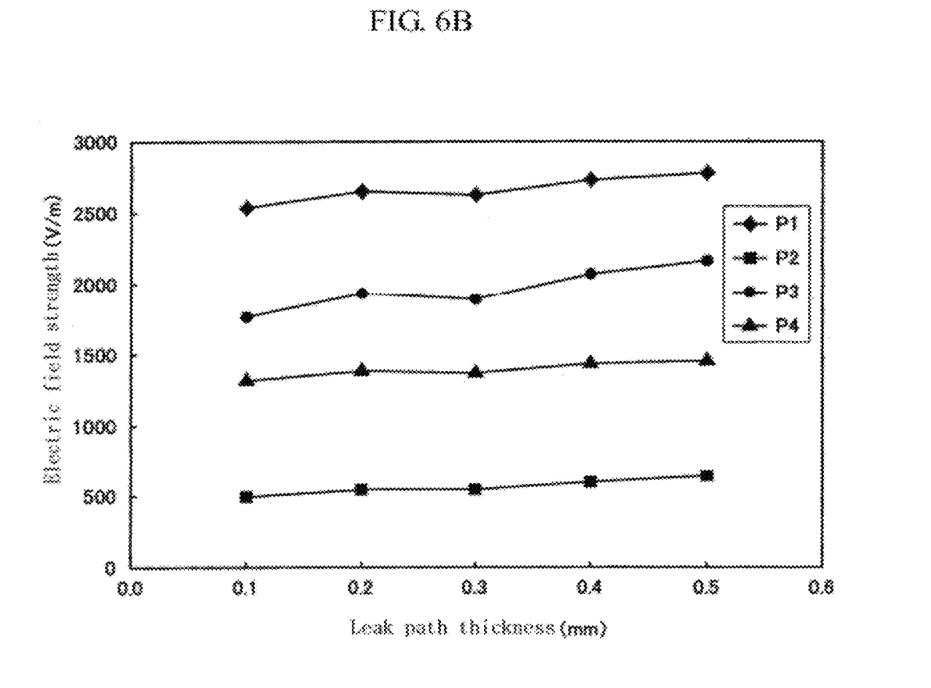

FIGS. 6A and 6B are a cross-sectional view and a graph of the result of simulation of the distribution of the electric field strengths near the gap G, respectively. Referring to FIGS. 6A and 6B, the electric field strengths at positions P1 through P4 shown in FIG. 6A were calculated by simulation, and the results are shown in FIG. 6B. Referring to the results illustrated in FIG. 6B, the electric field strengths of the microwaves at the positions P1 and P3 are higher than the electric field strengths of the microwaves at the positions P2 and P4. In addition, as the gap (leak path thickness) G increases, the electric field strengths increase, and if the gap G is uniform, even if the size of the gap G varies by 0.1 mm, the electric field strengths do not increase.

According to Paschen's Law, as defined by the formula $V=f(pd)$, a discharge firing voltage V between parallel electrodes is expressed as a function of a product of gas pressure (p) and a distance (d) between the electrodes. Since the amount of variation of the electric field strengths with respect to variation of the position of the gap G or variation of a uniform leak path thickness is small, it is considered that an effect caused by the concentration of an electric field on a narrow position is large. Thus, the gap G is set in the range of $(k\pm n)(n\leq 0.1)$ mm with respect to a predetermined reference distance kmm ($k\geq 0.3$) so that discharge does not occur easily and the electric field strengths are not easily biased, and thus occurrence of abnormal discharge may be prevented.

Figure 7:
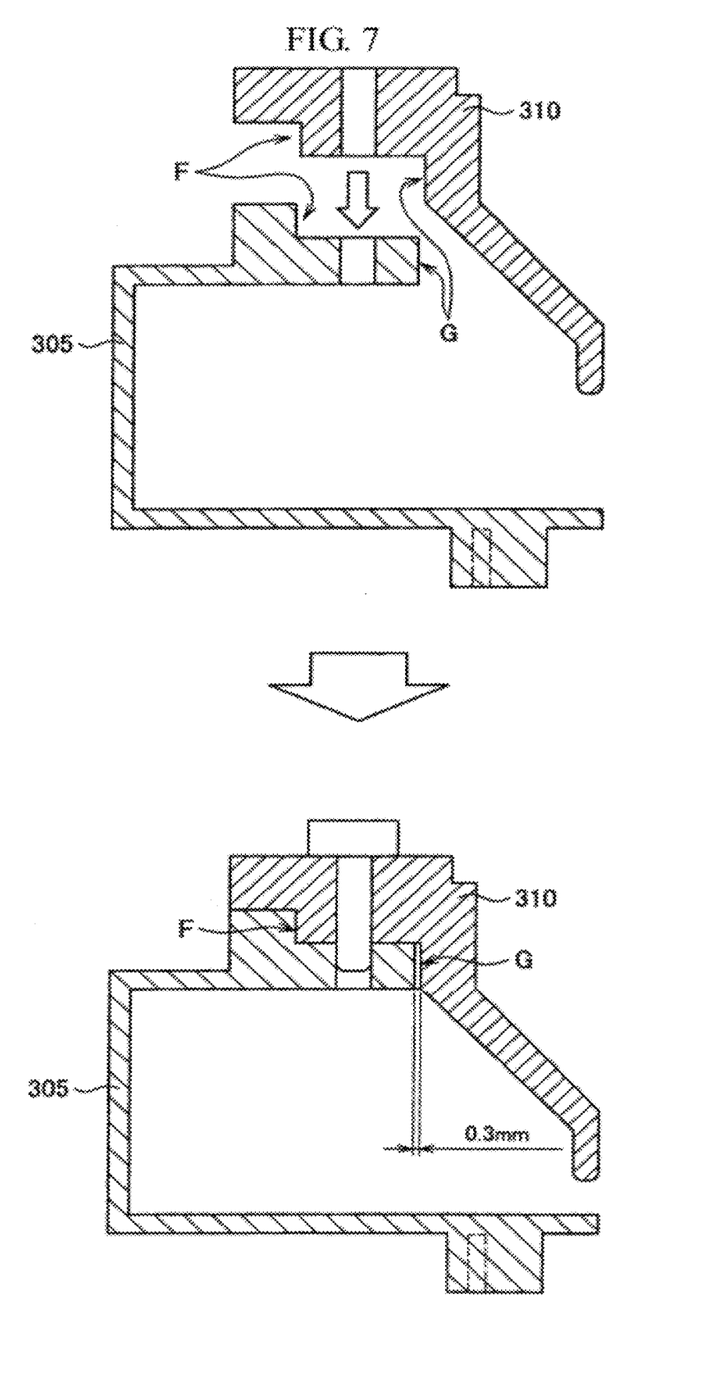
FIG. 7 is a view of an engagement structure in which a rectangular waveguide and a coaxial converter are engaged with each other.

Thus, even though the ring-shaped gap G is formed in any facing position, the high-degree engagement structure F (see FIGS. 5 and 7) is formed at the rectangular waveguide 305 and the coaxial converter 310 at an outer circumferential side from the gap G so that the gap G is formed within a predetermined range. Specifically, the engagement structure F is formed so that the reference distance k of the gap G is set to 0.3 mm and, even if the ring-shaped gap G is formed in any facing position, the gap G is adjusted within a range of $(k\pm n)$ mm ($n\leq 0.1$). A gap (i.e., within about 20% of a maximum of the gap G) that is sufficiently smaller than the gap G is allowed in the engagement structure F in consideration of tolerance that occurs during assembling so that any manufacturer may easily assemble the microwave plasma processing apparatus while maintaining the gap G within the gap allowed for a design of the microwave plasma processing apparatus. As such, occurrence of abnormal discharge in the gap G between the rectangular waveguide 305 and the coaxial converter 310 may be avoided.

<Coating With Insulating Material>

The rectangular waveguide 305 and the coaxial converter 310 near the gap G are coated with an insulating material. The insulating material may be polytetrafluoroethylene (PTFE), tetrafluoroethylene-perfluoroalkylvinylether (PFA) copolymers, alumina (alumite processing, spraying), or the like. As such, a potential difference in the gap G may be reduced so that occurrence of abnormal discharge may be more easily suppressed.

As described above, in the microwave plasma processing apparatus 10 according to the present embodiment, the air gap Ra during a temperature increase does not vary. Thus, the mode of the microwaves is stable, and uniform plasma may be generated. As such, the stability and reliability of the microwave plasma processing apparatus 10 may be improved.

In addition, the insulating material may be coated on the surface of at least one of the wavelength-shortening plate 205a and the cooling jacket 210. As such, the insulating material is coated on the wavelength-shortening plate 205a or the cooling jacket 210 so that a difference in electric potential generated in the air gap Ra between the cooling jacket 210 and the slot plate 205b may be reduced and thus occurrence of abnormal discharge may be suppressed.

In addition, a material that has a low friction coefficient and does not stir up dust even when sliding, such as PTFE or PFA, may be used as the insulating material to be coated on a circumference of the wavelength-shortening plate 205a or the cooling jacket 210.

In the above embodiment, operations of the elements are related to each other and may be substituted as a series of operations in consideration of the relation. By substituting the operations of the elements in this way, the embodiment of the microwave plasma processing apparatus may be used as an embodiment of a method of supplying the microwaves using the microwave plasma processing apparatus.

While this invention has been particularly shown and described with reference to exemplary embodiments thereof, it will be understood by those of ordinary skill in the art that various changes in form and details may be made therein without departing from the spirit and scope of the invention as defined by the appended claims.

For example, the engagement structure F may be included in the microwave plasma processing apparatus 10 according to the present invention but is not an essential construction of the microwave plasma processing apparatus 10.

In addition, the stepped part of the flange part 325a of the support member 325 may have two or more steps. However, in any case, in order to prevent abnormal discharge, the elastic body 330 is not disposed in the innermost stepped part of the flange part 325a of the support member 325.

In addition, gas may be supplied only from the upper gas supply lines 510 or only from the shower plate 515. Also, instead of the gas supply mechanism 500 or in addition to the gas supply mechanism 500, a gas path is formed in the top plate 105, and the top plate 105 may be used as a shower plate.

As described above, according to the present invention, when microwaves are supplied into a processing container by using an RLSA, variation of a transmission path of the microwaves, during an actual temperature increase, from the transmission path of the microwaves during a temperature increase set in a design of the microwave plasma processing apparatus, may be suppressed, and disturbance of plasma may be prevented.

What is claimed is:

1. A microwave plasma processing apparatus comprising:
a processing container in which plasma processing is performed; a microwave source outputting microwaves;
a rectangular waveguide transmitting the microwaves outputted from the microwave source;
a coaxial converter converting a mode of the microwaves transmitted to the rectangular waveguide;
a coaxial waveguide transmitting the microwaves of which the mode is converted by the coaxial converter;
a taper-shaped connector attached to an inner conductor of the coaxial waveguide;
a slot plate having a plurality of slots through which the microwaves are introduced into the processing container, the slot plate having an opening in the center of the slot plate;
a support member passing through the opening of the slot plate and connected to an under surface of the taper-shaped connector, wherein the support member is conductive; and
a conductive elastic body disposed between the slot plate and the support member, the conductive elastic body electrically connecting the slot plate with the taper-shaped connector and the slot plate through the support member.

2. The apparatus of claim 1 further comprising a wavelength-shortening plate that is formed to be adjacent to the slot plate and a cooling jacket that is formed to be adjacent to the wavelength-shortening plate,
wherein a gap is formed at least between the wavelength-shortening plate and the cooling jacket and between the taper-shaped connector and the wavelength-shortening plate.

3. The apparatus of claim 2, wherein the conductive elastic body is a linear metal shield member.

4. The apparatus of claim 1, wherein, after a temperature increases, a surface of the taper-shaped connector, which faces the object to be processed, and a surface of a wavelength-shortening plate adjacent to the slot plate, which faces the object to be processed, are located at the same level.

5. The apparatus of claim 1, wherein the support member comprises a flange part formed at an outer circumference of the support member, and the conductive elastic body is disposed between the flange part and the slot plate.

6. The apparatus of claim 5, wherein the flange part of the support member comprises a stepped part, and the conductive elastic body is disposed at an outer side than the innermost stepped part formed in the flange part.

7. The apparatus of claim 6, wherein edges of the flange part of the support member are rounded.

8. The apparatus of claim 5, wherein a distance between the flange part of the support member and the slot plate is set so that the conductive elastic body absorbs the displacement of the taper-shaped connector due to a temperature increase and electrically connects the slot plate to the inner conductor through the taper-shaped connector.

9. The apparatus of claim 1, wherein an insulating material is coated on a surface of at least one of a wavelength-shortening plate that is formed to be adjacent to the slot plate and a cooling jacket that is formed to be adjacent to the wavelength-shortening plate.

* * * * *